(12) United States Patent
Das et al.

(10) Patent No.: US 7,897,877 B2
(45) Date of Patent: Mar. 1, 2011

(54) CAPACITIVE SUBSTRATE

(75) Inventors: Rabindra N. Das, Ithaca, NY (US);
Frank D. Egitto, Binghamton, NY (US);
John M. Lauffer, Waverly, NY (US);
How T. Lin, Vestal, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 718 days.

(21) Appl. No.: 11/438,424

(22) Filed: May 23, 2006

(65) Prior Publication Data

US 2007/0275525 A1      Nov. 29, 2007

(51) Int. Cl.
H05K 1/16        (2006.01)

(52) U.S. Cl. .................. 174/260; 257/698; 257/700; 257/E23.169; 174/255; 174/256; 361/761; 361/803

(58) Field of Classification Search .............. 257/686, 257/E21.272, 528, 532, 698, 700, E25.024, 257/E23.168, E21.008; 361/307, 320, 321.3, 361/803, 766, 792, 793, 794, 795, 761; 174/260, 174/262, 255, 256; 438/381, 396, 393, 782, 438/785
See application file for complete search history.

(56) References Cited

U.S. PATENT DOCUMENTS

| | | | |
|---|---|---|---|
| 5,016,085 A | 5/1991 | Hubbard et al. | |
| 5,026,624 A | 6/1991 | Day et al. | |
| 5,079,069 A | 1/1992 | Howard et al. | |
| 5,099,309 A | 3/1992 | Kryzaniwsky | |
| 5,162,977 A | 11/1992 | Paurus et al. | |
| 5,280,192 A | 1/1994 | Kryzaniwsky | |
| 5,300,402 A | 4/1994 | Card, Jr. et al. | |
| 5,426,263 A | 6/1995 | Potter et al. | |
| 5,831,833 A | 11/1998 | Shirakawa et al. | |
| 6,068,782 A | 5/2000 | Brandt et al. | |
| 6,072,690 A * | 6/2000 | Farooq et al. | 361/321.2 |
| 6,084,306 A | 7/2000 | Yew et al. | |
| 6,150,456 A | 11/2000 | Lee et al. | |
| 6,207,595 B1 | 3/2001 | Appelt et al. | |
| 6,242,282 B1 | 6/2001 | Fillion et al. | |
| 6,370,012 B1 | 4/2002 | Adae-Amoakoh et al. | |
| 6,395,996 B1 | 5/2002 | Tsai et al. | |
| 6,446,317 B1 | 9/2002 | Figueroa et al. | |
| 6,524,352 B2 | 2/2003 | Adae-Amoakoh et al. | |
| 6,544,651 B2 | 4/2003 | Wong et al. | |
| 6,616,794 B2 | 9/2003 | Law et al. | |
| 6,704,207 B2 | 3/2004 | Kopf | |
| 7,239,013 B2 * | 7/2007 | Shimada et al. | 257/691 |

* cited by examiner

*Primary Examiner*—Julio J Maldonado
(74) *Attorney, Agent, or Firm*—Mark Levy; Lawrence R. Fraley; Hinman, Howard & Kattell

(57) ABSTRACT

A capacitive substrate and method of making same in which first and second glass layers are used. A first conductor is formed on a first of the glass layers and a capacitive dielectric material is positioned over the conductor. The second conductor is then positioned on the capacitive dielectric and the second glass layer positioned over the second conductor. Conductive thru-holes are formed to couple to the first and second conductors, respectively, such that the conductors and capacitive dielectric material form a capacitor when the capacitive substrate is in operation.

11 Claims, 2 Drawing Sheets

US 7,897,877 B2

CAPACITIVE SUBSTRATE

TECHNICAL FIELD

The present invention relates to methods of forming capacitors within circuitized substrates such as printed circuit boards, chip carriers and the like, and to products including such internal capacitors as part thereof.

CROSS-REFERENCE TO CO-PENDING APPLICATIONS

In Ser. No. 10/900,385, entitled "Circuitized Substrate With Internal Organic Memory Device, Method Of Making Same, Electrical Assembly Utilizing Same, and Information Handling System Utilizing Same" and filed Jul. 28, 2004, there is defined a circuitized substrate comprised of at least one layer of dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The substrate is preferably combined with other dielectric-circuit layered assemblies to form a multilayered substrate on which can be positioned discrete electronic components (e.g., a logic chip) coupled to the internal memory device to work in combination therewith. An electrical assembly capable of using the substrate is also provided, as is an information handling system adapted for using one or more such electrical assemblies as part thereof. This application is assigned to the same assignee of the present invention.

In Ser. No. 10/900,386, entitled "Electrical Assembly With Internal Memory, Circuitized Substrate Having Electrical Components Positioned Thereon, Method Of Making Same, And Information Handling System Utilizing Same" and filed Jul. 28, 2004, there is defined an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof. This application is also assigned to the same assignee as the present invention.

In Ser. No. 11/031,085, entitled "Capacitor Material For Use In Circuitized Substrates, Circuitized Substrate Utilizing Same, Method of Making Said Circuitized Substrate, and Information Handling System Utilizing Said Circuitized Substrate" and filed Jan. 10, 2005, there is defined a material for use as part of an internal capacitor within a circuitized substrate wherein the material includes a polymer (e.g., a cycloaliphatic epoxy or phenoxy based) resin and a quantity of nano-powders of ferroelectric ceramic material (e.g., barium titanate) having a particle size substantially in the range of from about 0.01 microns to about 0.90 microns and a surface area for selected ones of these particles within the range of from about 2.0 to about 20 square meters per gram. A circuitized substrate adapted for using such a material and capacitor therein and a method of making such a substrate are also defined. An electrical assembly (substrate and at least one electrical component) and an information handling system (e.g., personal computer) are also defined.

In Ser. No. 11/031,074, entitled "Capacitor Material With Metal Component For Use In Circuitized Substrates, Circuitized Substrate Utilizing Same, Method of Making Said Circuitized Substrate, and Information Handling System Utilizing Said Circuitized Substrate" and filed Jan. 10, 2005, there is defined a material for use as part of an internal capacitor within a circuitized substrate in which the material includes a polymer resin and a quantity of nano-powders including a mixture of at least one metal component and at least one ferroelectric ceramic component, the ferroelectric ceramic component nano-particles having a particle size substantially in the range of between about 0.01 microns and about 0.9 microns and a surface within the range of from about 2.0 to about 20 square meters per gram. A circuitized substrate adapted for using such a material and capacitor therein and a method of making such a substrate are also defined. An electrical assembly (substrate and at least one electrical component) and an information handling system (e.g., personal computer) are also defined.

In Ser. No. 11/172,794, entitled "Method Of Making An Internal Capacitive Substrate For Use In a Circuitized Substrate And Method Of Making Said Circuitized Substrate" and filed Jul. 5, 2005, there is defined a method of forming a capacitive substrate in which first and second conductors are formed opposite a dielectric, with one of these electrically coupled to a thru-hole connection. Each functions as an electrode for the resulting capacitor. The substrate is then adapted for being incorporated within a larger structure to form a circuitized substrate such as a printed circuit board or a chip carrier. Additional capacitors are also possible.

In Ser. No. 11/352,279, entitled "Method Of Making A Capacitive Substrate For Use As Part Of A Larger Circuitized Substrate, Method of Making Said Circuitized Substrate and Method Of Making An Information Handling System Including Said Circuitized Substrate", filed Feb. 13, 2006, there is defined a method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate. The capacitive substrate may be incorporated within a larger circuitized substrate, e.g., to form an electrical assembly. A method of making an information handling system including such substrates is also provided.

In Ser. No. 11/352,276, entitled "Method Of Making A Capacitive Substrate Using Photoimageable Dielectric For Use As Part Of A Larger Circuitized Substrate, Method of Making Said Circuitized Substrate and Method Of Making An Information Handling System Including Said Circuitized Substrate", filed Feb. 13, 2006, there is defined a method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate. Photoimageable material is used to facilitate positioning of the capacitive dielectric being printed. The capacitive substrate may be incorporated within a larger circuitized substrate, e.g., to form an electrical assembly. A method of making an information handling system including such substrates is also provided.

All of the above pending applications are assigned to the same Assignee as the present invention.

BACKGROUND OF THE INVENTION

Circuitized substrates such as printed circuit boards (hereinafter also referred to as PCBs), chip carriers, and the like are usually constructed in laminate form in which several layers of dielectric material (perhaps the best known is a fiberglass-reinforced epoxy resin occasionally referred to as "FR-4" dielectric material) and conductive material (usually copper) are bonded together using relatively high temperature and pressure lamination processes. The conductive layers, typically of thin copper, are usually used in the formed substrate for providing electrical connections to and among various devices located on the surface of the substrate, examples of such devices being integrated circuits (semiconductor chips) and discrete passive devices, such as capacitors, resistors, inductors, and the like. The discrete passive devices occupy a high percentage of the surface area of the completed substrate, which is undesirable from a future design aspect because of the increased need and demand for miniaturization in today's substrates and products containing same art.

To increase the available substrate surface area (also often referred to as "real estate") of such substrates, there have been a variety of efforts to include multiple functions (e.g. resistors, capacitors and the like) on a single component for mounting on a board. When passive devices are in such a configuration, these are often referred to collectively and individually as integral passive devices or the like, meaning that the functions are integrated into the singular component. Because of such external positioning, these components still utilize, albeit less than if in singular form, valuable board real estate. In response, there have also been efforts to embed discrete passive components within the board, such components often also referred to as embedded passive components. A capacitor designed for disposition within (between selected layers of) a PCB (board) substrate may thus be referred to as an embedded integral passive component, or, more simply, an embedded capacitor. Such a capacitor thus provides internal capacitance. The result of this internal positioning is that it is unnecessary to also position such devices externally on the PCB's outer surface(s), thus saving valuable PCB real estate.

For a fixed capacitor area, two known approaches are available for increasing the planar capacitance (capacitance/area) of an internal capacitor. In one such approach, higher dielectric constant materials can be used, while in a second, the thickness of the dielectric can be reduced. These constraints are reflected in the following formula, known in the art, for capacitance per area:

$$C/A = (\text{Dielectric Constant of Laminate} \times \text{Dielectric Constant in Vacuum/Dielectric Thickness})$$

where: C is the capacitance and A is the capacitor's area. Some of the patents listed below, particularly U.S. Pat. No. 5,162,977, mention use of various materials for providing desired capacitance levels under this formula, and many mention or suggest problems associated with the methods and resulting materials used to do so.

As stated, there have been past attempts to provide internal capacitance and other internal conductive structures, components or devices (one good example being internal semiconductor chips) within circuitized substrates such as PCBs, some of these including the use of nano-powders (as also defined in Ser. No. 11/031,085 and Ser. No. 11/172,794 cited above). The following are some examples of such attempts, including those using nano-powders and those using alternative measures.

In U.S. Pat. No. 6,704,207, entitled "Device and Method for Interstitial Components in a Printed Circuit Board", issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor (manufactured by Rohm Co.), which has a thickness of about 0.014 inches.

In U.S. Pat. No. 6,616,794, entitled "Integral Capacitance For Printed Circuit Board Using Dielectric Nanopowders" and issued Sep. 9, 2003, there is described a method for producing integral capacitance components for inclusion within printed circuit boards in which hydro-thermally prepared nano-powders permit the fabrication of dielectric layers that offer increased dielectric constants and are readily penetrated by micro-vias. In the method described in this patent, a slurry or suspension of a hydro-thermally prepared nano-powder and solvent is prepared. A suitable bonding material, such as a polymer, is mixed with the nano-powder slurry, to generate a composite mixture which is formed into a dielectric layer. The dielectric layer may be placed upon a conductive layer prior to curing, or conductive layers may be applied upon a cured dielectric layer, either by lamination or metallization processes, such as vapor deposition or sputtering.

In U.S. Pat. No. 6,544,651, entitled "High Dielectric Constant Nano-Structure Polymer-Ceramic Composite" and issued Apr. 3, 2003, there is described a polymer-ceramic composite having high dielectric constants formed using polymers containing a metal acetylacetonate (acacs) curing catalyst. In particular, a certain percentage of Co (III) may increase the dielectric constant of a certain epoxy. The high dielectric polymers are combined with fillers, preferably ceramic fillers, to form two phase composites having high dielectric constants. Composites having about 30 to about 90% volume ceramic loading and a high dielectric base polymer, preferably epoxy, were apparently found to have dielectric constants greater than about 60. Composites having dielectric constants greater than about 74 to about 150 are also mentioned in this patent. Also mentioned are embedded capacitors with capacitance densities of at least 25 nF/cm.sup.2, preferably at least 35 nF/cm.sup.2, most preferably 50 nF/cm.sup.2.

In U.S. Pat. No. 6,524,352, entitled "Method Of Making A Parallel Capacitor Laminate" and issued Feb. 25, 2003, there is defined a parallel capacitor structure capable of forming an internal part of a larger circuit board or the like structure to provide capacitance therefore. Alternatively, the capacitor may be used as an inter-connector to interconnect two different electronic components (e.g., chip carriers, circuit boards, and semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,446,317, entitled "Hybrid Capacitor And Method Of Fabrication Therefor", and issued Sep. 10, 2002, there is described a hybrid capacitor associated with an integrated circuit package that provides multiple levels of excess, off-chip capacitance to die loads. The hybrid capacitor includes a low inductance, parallel plate capacitor which is embedded within the package and electrically connected to a second source of off-chip capacitance. The parallel plate capacitor is disposed underneath a die, and includes a top conductive layer, a bottom conductive layer, and a thin dielectric layer that electrically isolates the top and bottom layers. The second source of off-chip capacitance is a set of self-aligned via capacitors, and/or one or more discrete capacitors, and/or an additional parallel plate capacitor. Each of the self-aligned via capacitors is embedded within the package, and has an inner conductor and an outer conductor. The inner conductor is electrically connected to either the top or bottom conductive layer, and the outer conductor is electrically connected to the other conductive layer. The discrete capacitors are electrically connected to contacts from the conductive layers to the surface of the package. During operation, one of the conductive layers of the low inductance parallel plate capacitor provides a ground plane, while the other conductive layer provides a power plane.

In U.S. Pat. No. 6,395,996, entitled "Multi-layered Substrate With Built-In Capacitor Design" and issued May 28, 2002, there is described a multi-layered substrate having built-in capacitors which are used to decouple high frequency noise generated by voltage fluctuations between a power plane and a ground plane of a multi-layered substrate. At least one kind of dielectric material, which has filled-in through holes between the power plane and the ground plane and includes a high dielectric constant, is used to form the built-in capacitors.

In U.S. Pat. No. 6,370,012, entitled "Capacitor Laminate For Use In A Printed Circuit Board And As An Inter-connector" and issued Apr. 9, 2002, there is described a parallel capacitor structure capable of forming an internal part of a larger circuit board or the like structure to provide capacitance there-for. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,242,282, entitled "Circuit Chip Package and Fabrication Method", issued Jun. 5, 2001, there is described a method for packaging a chip which includes the steps of providing an interconnect layer including insulative material having a first side and a second side, initial metallization patterned on second side metallized portions of the second side and not on second side non-metallized portions of the second side, a substrate via extending from the first side to one of the second side metallized portions, and a chip via extending from the first side to the second side non-metallized portion. The method also includes positioning a chip on the second side with a chip pad of the chip being aligned with the chip via, and patterning connection metallization on selected portions of the first side of the interconnect layer and in the via so as to extend to the second side metallized portion and to the chip pad. About the chip is molded a "substrate" or other dielectric material.

In U.S. Pat. No. 6,207,595, entitled "Laminate and Method of Manufacture Thereof", issued Mar. 27, 2001, there is described a fabric-resin dielectric material for use in a laminate structure and method of its manufacture. The resulting structure is adaptable for use in a printed circuit board or chip carrier substrate. The resin may be an epoxy resin such as is currently used on a large scale worldwide for "FR-4" composites. A resin material based on bismaleimide-triazine (BT) is also acceptable, this patent further adding that, more preferably, the resin is a phenolically hardenable resin material as is known in the art, with a glass transition temperature of about 145 degrees Celsius (C.).

In U.S. Pat. No. 6,150,456, entitled "High Dielectric Constant Flexible Polyimide Film And Process Of Preparations, issued Nov. 21, 2000, there is described a flexible, high dielectric constant polyimide film composed of either a single layer of an adhesive thermoplastic polyimide film or a multilayer polyimide film having adhesive thermoplastic polyimide film layers bonded to one or both sides of the film and having dispersed in at least one of the polyimide layers from 4 to 85 weight % of a ferroelectric ceramic filler, such as barium titanate or polyimide-coated barium titanate, and having a dielectric constant of from 4 to 60. The high dielectric constant polyimide film can be used in electronic circuitry and electronic components such as multilayer printed circuits, flexible circuits, semiconductor packaging and buried (internal) film capacitors.

In U.S. Pat. No. 6,084,306, entitled "Bridging Method of Interconnects for Integrated Circuit Packages", issued Jul. 4, 2000, there is described an integrated circuit package having first and second layers, a plurality of routing pads being integral with the first layer, a plurality of upper and lower conduits, respectively, disposed on the upper and lower surfaces of the first layer, one of the upper conduits electrically connected to one of the lower conduits, a plurality of pads disposed on the second layer, vias that electrically connect the pads to the lower conduits and a chip adhered to the second layer having bonding pads, at least one of which is electrically connected to one of the routing pads.

In U.S. Pat. No. 6,068,782, entitled "Individual Embedded Capacitors For Laminated Printed Circuit Boards" and issued May 30, 2000, there is described a method of fabricating individual, embedded capacitors in multilayer printed circuit boards. The method is allegedly compatible of being performed using standard printed circuit board fabrication techniques. The capacitor fabrication is based on a sequential build-up technology employing a first pattern-able insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation or by depositing conductive ink.

In U.S. Pat. No. 5,831,833, entitled "Bare Chip Mounting Printed Circuit Board and a Method of Manufacturing Thereof by Photo-etching", issued Nov. 3, 1998, there is described a method of manufacturing a "bare chip" multilayer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board. In what appears to be the preferred embodiment, one of the insulating layers is made from a photosensitive resin, and the bare chip part mounting recessed portion is formed by photo-etching the insulating layer made from the photosensitive resin.

In U.S. Pat. No. 5,426,263, entitled "Electronic Assembly Having a Double-sided Leadless Component", issued Jun. 20, 1995, there is described an electronic assembly which has a double-sided leadless component and two printed circuit boards. The component has a plurality of electrical terminations or pads on both opposing major surfaces. Each of the printed circuit boards has a printed circuit pattern that has a plurality of pads that correspond to the electrical terminations on both sides of the double-sided leadless component. The electrical terminals on one side of the component are attached to the pads on the first board and the electrical terminals on the other side of the leadless component are attached to the pads on the second board. The printed circuit boards are joined together to form a multilayered circuit board so that the double-sided leadless component is buried or recessed inside. The component is attached to the pads of the printed circuit board using solder.

In U.S. Pat. No. 5,280,192, entitled "Three-dimensional Memory Card Structure With Internal Direct Chip Attachment", issued Jan. 18, 1994, there is described a card structure which includes an internal three dimensional array of implanted semiconductor chips. The card structure includes a power core and a plurality of chip cores. Each chip core is joined to the power core on opposite surfaces of the power core, and each chip core includes a compensator core having a two dimensional array of chip wells. Each chip well allows for a respective one of the semiconductor chips to be implanted therein. Further, a compliant dielectric material is disposed on the major surfaces of the compensator core except at the bottoms of the chip wells. The compliant dielectric material has a low dielectric constant and has a thermal coefficient of expansion compatible with those of the semiconductor chips and the compensator core, so that thermal expansion stability with the chips and the compensator core is maintained.

In U.S. Pat. No. 5,162,977, entitled "Printed Circuit Board Having An Integrated Decoupling Capacitive Element" and issued Nov. 10, 1992, there is described a PCB which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferro-electric ceramic substance having a high dielectric constant. The ferro-electric ceramic substance is typically a nano-powder combined with an epoxy bonding material. According to this patent, the resulting capacitance of the power distribution core is sufficient to totally eliminate the need for decoupling capacitors on a PCB.

In U.S. Pat. No. 5,099,309, entitled "Three-dimensional Memory Card Structure With Internal Direct Chip Attachment", issued Mar. 24, 1992, there is described a memory card structure containing an embedded three dimensional array of semiconductor memory chips. The card structure includes at least one memory core and at least one power core which are joined together in an overlapping relationship. Each memory core comprises a copper-invar-copper (CIC) thermal conductor plane having a two dimensional array of chip well locations on each side of the plane. Polytetrafluoroethylene (PTFE) covers the major surfaces of the thermal conductor plane except at the bottoms of the chip wells. Memory chips are placed in the chip wells and are covered by insulating and wiring levels. Each power core comprises at least one CIC electrical conductor plane and PTFE covering the major surfaces of the electrical conductor plane. Provision is made for providing electrical connection pathways and cooling pathways along vertical as well as horizontal planes internal to the card structure.

In U.S. Pat. No. 5,079,069, entitled "Capacitor Laminate For Use In Capacitive Printed Circuit Boards And Methods Of Manufacture" and issued Jan. 7, 1992, there is described a capacitor laminate which allegedly serves to provide a bypass capacitive function for devices mounted on the PCB, the capacitor laminate being formed of conventional conductive and dielectric layers whereby each individual external device is allegedly provided with capacitance by a proportional portion of the capacitor laminate and by borrowed capacitance from other portions of the capacitor laminate, the capacitive function of the capacitor laminate being dependent upon random firing or operation of the devices. That is, the resulting PCB still requires the utilization of external devices thereon, and thus does not afford the PCB external surface area real estate savings mentioned above which are desired and demanded in today's technology.

In U.S. Pat. No. 5,016,085, entitled "Hermetic package for integrated circuit chips, issued May 14, 1991, there is described a hermetic package which has an interior recess for holding a semiconductor chip. The recess is square and set at 45 degrees with respect to the rectangular exterior of the package. The package uses ceramic layers which make up the package's conductive planes with the interior opening stepped to provide connection points. The lowest layer having a chip opening therein may be left out of the assembly to provide a shallower chip opening recess. This of course is not the same as an internally formed capacitance or semiconductor component of the nature described above, but it does mention internal ceramic layers for a specified purpose as part of an internal structure.

Generally speaking, with respect to commercially available dielectric powders which have been used in internal conductive structures such as mentioned in some of the above patents, among these being metal titanate-based powders (see, e.g., U.S. Pat. No. 6,150,456), such powders are known to be produced by a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees Celsius (C), to attain the desired solid state reactions. Thereafter, the fired product is milled to produce a powder. Although the pre-fired and ground dielectric formulations produced by solid phase reactions are acceptable for many electrical applications, these suffer from several disadvantages. First, the milling step serves as a source of contaminants, which can adversely affect electrical properties. Second, the milled product consists of irregularly shaped fractured aggregates which are often too large in size and possess a wide particle size distribution, 500-20,000 nm. Consequently, films produced using these powders are limited to thicknesses greater than the size of the largest particle.

Thirdly, powder suspensions or composites produced using pre-fired ground ceramic powders typically must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the PCB's internal components or the like, such as those described in selected ones of the above patents, possess various undesirable aspects which are detrimental to providing a PCB with optimal functioning capabilities when it comes to internal capacitance or other electrical operation. This is particularly true when the desired final product attempts to meet today's miniaturization demands, including the utilization of high density patterns of thru-holes therein.

Ser. No. 11/172,794, mentioned above, defines a new and unique method of making a capacitive substrate in which the method can be performed in a facile manner using, for the most part, conventional substrate processes. As shown in this pending application's drawings, a multiple (two or more) capacitor structure is formed using two similarly formed "sandwiches" each of an interim dielectric layer having opposed conductive layers thereon. At least one conductive layer of each "sandwich" is circuitized and includes individual conductors as part thereof. The two structures are bonded together, e.g., using conventional lamination processing, with an interim dielectric layer, to form a multi-layered substrate in which at least two capacitors are internally located and adapted for being coupled to other parts of the substrate's circuitry. Thru-holes are formed within the substrate to also provide connections to respective parts of the capacitor conductive members. Two examples of completed substrates are shown in Ser. No. 11/172,794.

As defined herein, the present invention represents another approach to forming internal capacitors in a substrate. In the present invention, at least one capacitor may be formed by initially providing a glass layer and then a conductor thereon, following which the conductor is covered with a capacitive dielectric material. Following this, a second conductor is formed on the dielectric material and a second glass layer applied over the second conductor. Thru-holes are formed to couple to the first and second conductors such that a capacitor is formed and operational when the substrate is itself in operation. The use of glass in this manner allows a much closer match to the coefficient of thermal expansion with a semiconductor chip (if used) than many known dielectric materials (especially the above mentioned "FR4" material), in addition to a higher thermally conducting package (the substrate, a chip and other components normally used in various electronic package structures) and a substrate with significantly lower signal loss than those of many conventional dielectric materials. It is believed that such a capacitive substrate and a method of making same will represent significant advancements in the art.

OBJECTS AND SUMMARY OF THE INVENTION

It is, therefore, a primary object of the present invention to enhance the circuitized substrate art by providing a circuitized substrate having the advantageous features taught herein.

It is another object of the invention to provide a method of making such a circuitized substrate which can be accomplished in a relatively facile manner and at relatively low costs.

According to one embodiment of the invention, there is provided a method of making a capacitive substrate which comprises the steps of providing a first glass layer having a first surface and a second surface, providing a first conductor on the first surface of the first glass layer, positioning a capacitive dielectric layer on the first surface of the first glass layer and substantially over the first conductor, providing a second conductor on the first capacitive dielectric layer, positioning a second glass layer on the first capacitive dielectric layer and substantially over the second conductor, this second glass layer having a first surface, forming a first thru-hole electrical connection to the first conductor, and forming a second thru-hole electrical connection to the second conductor, the first and second conductors and the capacitive dielectric layer forming a capacitor when the capacitive substrate is in operation.

According to another embodiment of the invention, there is provided a capacitive substrate comprising a first glass layer having a first surface and a second surface, a first conductor on the first surface of said the glass layer, a capacitive dielectric layer on the first surface of the first glass layer and substantially over the first conductor, a second conductor on the first capacitive dielectric layer, a second glass layer on the first capacitive dielectric layer and substantially over the second conductor, the second glass layer having a first surface, a first thru-hole electrical connection to the first conductor, and a second thru-hole electrical connection to the second conductor, the first and second conductors and the capacitive dielectric layer forming a capacitor when the capacitive substrate is in operation.

BEST MODE OF CARRYING OUT THE INVENTION

Figure 1:
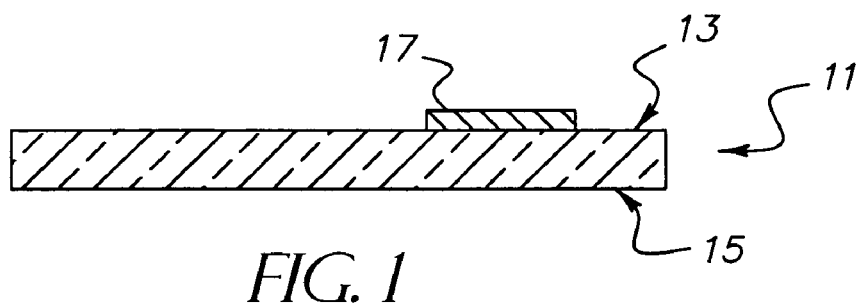
FIGS. 1-5 are enlarged elevational views, in cross-section, illustrating the steps of making a capacitive substrate according to one aspect of the invention.

For a better understanding of the present invention, together with other and further objects, advantages and capabilities thereof, reference is made to the following disclosure and appended claims in connection with the above-described drawings. Like figure numbers may be used from FIG. to FIG. to identify like elements in these drawings.

By the term "capacitive substrate" as used herein is meant a substrate including at least one capacitive dielectric layer and at least two conductors which function with the capacitive dielectric as a capacitor when incorporated within a larger, multi-layered substrate, thereby forming an internal capacitive member for said larger substrate, this latter substrate referred to as a "circuitized substrate." Such a capacitive substrate, in its simplest form, may be used alone, if additional structural elements as defined herein-below are also provided.

By the term "circuitized substrate" as used herein, therefore, is meant to include a multi-layered structure including one or more of the above-identified "capacitive substrates." Unlike the capacitive dielectric layers used in the capacitive substrate as defined herein, however, the added dielectric layers which may be used to form the larger, circuitized substrate may be made from more conventional dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials. Additional conductive layers for such a larger substrate are each a metal layer (e.g., power, signal and/or ground) comprised of suitable metallurgical materials such as copper, but may include or comprise additional metals (e.g., nickel, aluminum, etc.) or alloys thereof. As stated, these added dielectric materials are understood to be different than the capacitive dielectric layers used in the capacitive substrates taught herein. Further examples will be described in greater detail herein-below. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imageable material provides a toughened base of dielectric on which the desired electrical circuitry is formed. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant available from the Minnesota Mining & Manufacturing (3M) Company; 3.85% Aerosil 380, an amorphous silicon dioxide from Degussa AG (of Dusseldorf, Germany) to provide the solid content. A solvent is present from about 11 to about 13.5% of the total photo-imageable dielectric composition. Examples of circuitized substrates include those usable for printed circuit boards (or cards) and chip carriers.

By the term "electrical component" as used herein is meant components such as semiconductor chips and the like which are adapted for being positioned on the external conductive surfaces of substrates and electrically coupled to the substrate for passing signals from the component into the substrate whereupon such signals may be passed on to other components, including those mounted also on the substrate, as well as other components such as those of a larger electrical system in which the substrate is positioned.

By the term "electrical assembly" is meant at least one circuitized or capacitive substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several external components such as chip carriers, semiconductor chips, etc. mounted thereon and coupled to the internal circuitry of the PCB.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB may be referred to as a "motherboard" while various other boards (or cards) may be mounted thereon using suitable electrical connectors.

By the term "glass" as used herein is meant any of various amorphous materials formed from a melt by cooling to rigidity without crystallization. The best known of such materials is amorphous silicon dioxide as a primary component, but also possibly including other substances such as soda (sodium carbonate) or potash, the equivalent potassium compound (to lower the melting point) and lime (to restore insolubility). Other substances may also be added (including other than one or more of the above), including lead (for brilliance), boron (to affect the thermal and electrical properties), barium (for increased refractive index) cerium (for increased infrared energy absorption) and metal oxides (for color changes). A still further possibly added substance may include manganese (to remove unwanted colors).

By the term "ink jet printing" as used herein is meant to include conventional ink jet printing processes as used today to deposit inks onto designated targets. Equipment used for this purpose typically includes a plurality of print heads which direct the ink "spray" onto the targets.

By the term "thru-hole" as used herein is meant to include what are also commonly referred to in the industry as "blind vias" which are vias or openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHS), which typically extend through the entire thickness of a substrate. All of these various openings form electrical paths through the substrate and often include one or more conductive layers, e.g., plated copper, thereon. Alternatively, such openings may simply include a quantity of conductive paste or, still further, the paste can be additional to plated metal on the opening sidewalls. These openings in the substrate are formed typically using mechanical drilling or laser ablation, following which the plating and/or conductive paste are be added.

As understood from the teachings herein, an important feature of this invention is the utilization of glass material for at least two of the dielectric layers within the formed capacitive substrate. The use of glass in the manner taught herein provides several advantages over conventional dielectric materials, including closely matched coefficients of thermal expansion (CTE's), high thermally conducting package structures, the ability to locate several chips in a relatively small area (dense packaging) and other advantages discernible from the teachings herein.

In FIG. 1, a first layer 11 of glass material is provided, layer 11 including opposing (upper and lower) surfaces 13 and 15. The preferred glass material is silicon dioxide, albeit others are acceptable. In one example, layer 11 is about forty mils (a mil being a thousandth of an inch) thick. Layer 11 includes a first conductor 17 on surface 13, which is preferably gold and deposited using a known sputtering process. In this process, if gold is used, atoms from a solid gold target material are ejected into the gas phase due to bombardment of the material by energetic ions. It is commonly used for gold thin-film deposition. As understood, sputtering processes of this type are known in the substrate art and further description is not deemed necessary. It is also understood that although only gold conductor 17 is shown on layer 11, the invention is not so limited as it is within the scope of this invention to provide several metal (e.g., aluminum) and oxide (e.g., tin oxide, indium tin oxide, doped tin oxide) conductors layer 11. Additionally, multiple materials such as copper-gold, copper-nickel-gold, and monel may be used, as may be chrome and titanium, all of which may be deposited sequentially or simultaneously. In one embodiment, conductor 17 is of rectangular configuration having side dimensions of 200 mils by 100 mils and a thickness of only about 0.1 mil. Conductor 17 may of course be of different configurations and is not limited to rectangular, or to the dimensions cited. It is understood that conductor 17 is to become the first of two conductors of a capacitor, defined in greater detail below. It is also understood that although only one such conductor 17 is shown on layer 11, the invention is not so limited as it is within the scope of this invention to provide several capacitors on layer 11. The illustration of just the one conductor 17 (and thus one capacitor) is for representation purposes.

Figure 2:
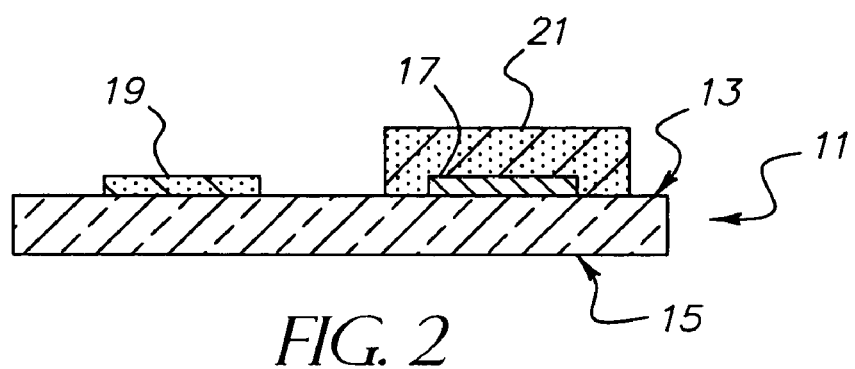

In FIG. 2, a capacitive dielectric layer 21 is positioned over conductor 17 and onto adjacent parts of surface 13 of layer 11. The preferred material for layer 21 is barium titanate, but other materials are acceptable, including substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite and other ferroelectric tantalates. Mixtures of two or more of such materials are possible as well. Layer 21 may be applied using a variety of processes.

In one embodiment, layer 21 is ink jet printed from a solution of the barium titanate and allowed to dry on the glass at a temperature within the range of from about 150 degrees Celsius (C) to about 450 degrees C. to remove undesirable organic elements. In a specific example, the solution may dry at a temperature of 200 degrees C. for a time period of approximately sixty minutes. Ink jet printers capable of depositing layer 21 are known, and provide small droplets (dots) of material (ink if printing ink) onto objects (here, substrates) to create a defined image. The dots are extremely small (usually between 50 and 60 microns in diameter) and are positioned very precisely. One example of this process is also known as drop on demand printing. The material being deposited must be stable during the printing process. In the case of the instant invention, acidic barium titanate solution is used and has been found to be very stable for extended periods of time.

In a second embodiment, layer 21 may be deposited using a physical process such as sputtering (defined above) and pulse laser deposition (PLD), both of these processes requiring a mask (not shown) such that the configuration shown in FIG. 2 is attained. If pulse laser deposition is utilized, targets are preferably ablated using an excimer laser at a fixed wavelength focused onto a sintered target (the barium titanate) with a fluence (energy density) at about 2 J/cm$^2$ at various repetition rates. The distance between target and substrate was fixed at about 6 cm. Actual deposition was performed in an ambient pressure of 140-250 mTorr oxygen and the deposition chamber was pumped to <10$^{-5}$ Torr prior to the deposition. Substrate temperature was maintained at 700 degree C. After the deposition, the chamber was filled with oxygen to 1 atmosphere. This process produce crystalline barium titanate film directly on the substrate. In one embodiment, layer 21 is 0.01 mil thick (from the upper surface 13 of glass layer 11) and 0.01 mil thick from the upper surface of conductor 17. This latter dimension is considered important to determine the eventual capacitance of the capacitor being formed. It is thus possible to vary the final capacitance values for the capacitor formed in accordance with the teachings herein, a significant feature of this invention. With a thickness of 0.01 mil and using two gold conductors (the second conductor defined below), a capacitance of about 5000 pF/mm$^2$ is possible. Increasing the capacitance dielectric material's thickness understandably serves to decrease the capacitance, and providing the material thinner results in a higher capacitance.

Dried layer 21 is next subjected to two heating steps. In the first, layer 21 may be heated in a conventional oven to a temperature within the range of from about 400 degrees C. to about 800 degrees C., for a time period of from about sixty minutes to about 240 minutes. In a more specific example, layer 21 was heated to about 450 degrees C. for a time period of sixty minutes. This heating step is designed to crystallize the barium titanate, and, significantly, does not adversely affect the gold conductor 17. In a second heating step, layer 21 is subjected to laser annealing, which serves as a surface treatment process. Laser annealing is an ultra-fast process. It can produce ultra-high power density (up to 30 megawatt/square centimeter in just 30 nano seconds) near the exposed surface and shows minimal heating beneath absorptive films/surface due to low total energy deposition. It has extremely high cooling rate (>10$^9$° C./s) and sharp temperature gradients. In one example, the laser used was a xenon chloride laser, with a laser energy of 250 mJ/cm$^2$ applied onto layer 21 for a time period of only about 1500 nanoseconds. This is not meant to limit the invention, because it has been determined that application of different levels of laser energy will affect the resulting capacitance for the capacitor formed in accordance with the instant teachings. For example, applying the above energy to the layer 21 having the defined thickness of 0.01 mil resulted in a capacitance density of 3000 pF/mm$^2$, a three-fold increase over the initial capacitance of this thickness prior to said laser annealing. If an increased laser energy of 370 mJ/cm$^2$ is applied to this same thickness, the resulting capacitance will increase to 5000 pF/mm$^2$. The above described dual heating operation is considered an important and extremely valuable part of this invention. Capacitance increases gradually with increasing laser energy and attains maximum. After that, capacitance drops due to formation of multiple low dielectric phases. A third heating step may be used to generate different crystalline phases in the laser-annealed spots. The aforementioned dual heating operation is important to generate a high capacitance density film layer. Thermal treatment of the capacitance layer removes substantially all of the organics from the layer and substantially converts the capacitance layer into oxide material. For example, if barium acetate and titanium isopropoxide solution are used to make barium titanate film, heat-treatment at 450° C. will remove substantially all the organics and initiate a barium titanate oxide phase. Subsequent selective laser annealing will then improve crystallinity and capacitance. Direct laser annealing (without the defined heat-treatment) will not produce a satisfactory amount of barium titanate oxide film because it tends to evaporate the barium acetate and titanium isopropoxide salt.

Figure 3:
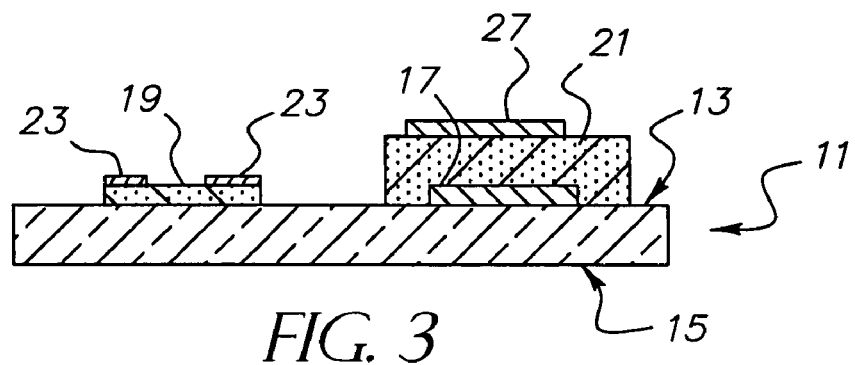

In accordance with the teachings herein, as shown in FIG. 3, it is now possible to provide one or more additional conductive members 19 on surface 13. Conductive member 19 may serve to function as a signal conductor, a resistor, or other conductive element, depending on the circuit requirements for the end product. It is also understood that more than one such conductive members 19 may be formed on the glass layer 11, and the invention is not limited to only one. In one embodiment, member 19 is a resistor and is deposited by sputtering. During such sputtering, a thin layer of metal, preferably nickel or nickel alloy, is vacuum-deposited on layer 11, preferably at a thickness of about 0.05 microns to about 0.5 microns, a most preferred thickness being about 0.1 micron. This sputter may also include providing a barrier metal layer prior to the nickel layer. The barrier layer may comprise chrome or titanium with a thickness of 50 Angstroms to about 500 Angstroms. If conductive member 19 is to function as a signal conductor, the sputtered nickel or nickel alloy layer may be used as a seed layer for a subsequent copper electroplating. The preferred electroplating process, if used, is pattern plating whereby a layer of photo-resist is applied to the sputtered nickel or nickel alloy layer and then imaged and developed in a desired configuration (e.g., rectangular in cross-section). If conductive member 19 is to function as a resistor, the nickel or nickel alloy is then subjected to a second sputtering operation in which a pair of opposed gold conducting members 23 are formed, using a gold sputtering operation as used to deposit conductor 17. Each gold conducting member is preferably only about 0.1 mil thick.

As further seen in FIG. 3, a second conductor 27 is now formed, this time atop the deposited capacitive dielectric material 21. Conductor 27 is understood to represent the second electrode for the formed capacitor, the first conductor 17 to function as the first electrode. Conductor 27 is gold, and may be sputter deposited simultaneously with the sputter deposition of members 23, thereby reducing time and costs for this aspect of the process. Conductor is of similar configuration as conductor 17, and of a similar thickness. The overall thickness for the capacitor, taken from the outer surfaces of both opposed conductors 17 and 27, through the capacitance material, is about 0.21 mils.

Figure 4:
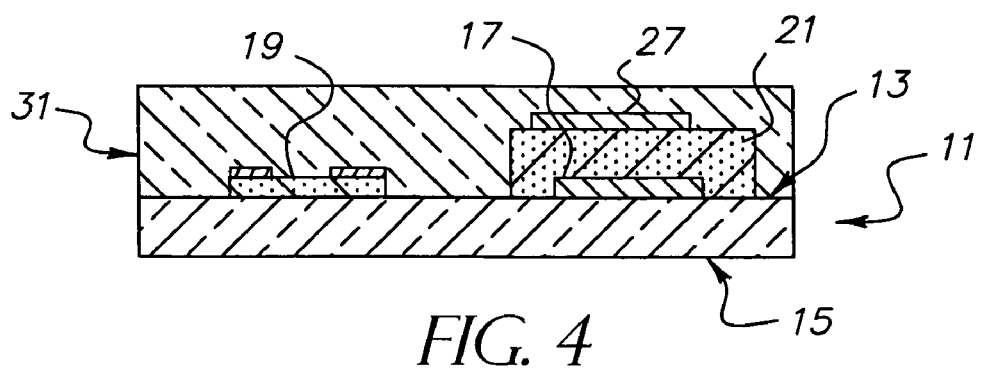

In FIG. 4, a second glass layer 31 is now deposited to cover all of the exposed surfaces of conductor 27 and underlying capacitive dielectric material 21, in addition to the adjacent resistor, should this member be formed as defined above. The material for glass layer 31 is preferably the same as first layer 11, although this is not to limit the invention as other glass materials may be used at this time. One means of depositing layer 31 is to use a spin coating operation using either a tetraethoxy silane or a tetramethoxy silane solution. Once applied as shown, the layer 31 is dried at a similar temperature and for a similar time period as was layer 11. In an alternative embodiment, material 31 may be deposited by a physical process such as chemical vapor deposition, followed by a similar drying operation (to remove undesired organic elements). The glass layer 31 is now also subjected to a separate heat-treatment operation, as was capacitive material layer 21. In one embodiment, this involved heating the substrate having layer 31 thereon to a temperature of from about 400 degrees C. to about 1000 degrees C., a temperature greater than that of the material 21. In one more specific example, the temperature was about 800 degrees C. and the time period was about 60 minutes. It is also possible to use the above-defined laser annealing process to control loss and reduce defects. It is thus seen that the FIG. 4 structure has been subjected to at least two separate heat-treatment operations, over and above the defined heating steps to initially dry the respective material and drive off undesired organic elements. Such a dual heat-treatment procedure, if utilizing laser annealing, is considered significant because laser annealing can be done selectively and variably to provide a wide range of capacitance density across the substrate. Laser annealing also repairs internal porosity, pin hole and cracking defects and thus is a good approach to repair capacitors.

Figure 5:
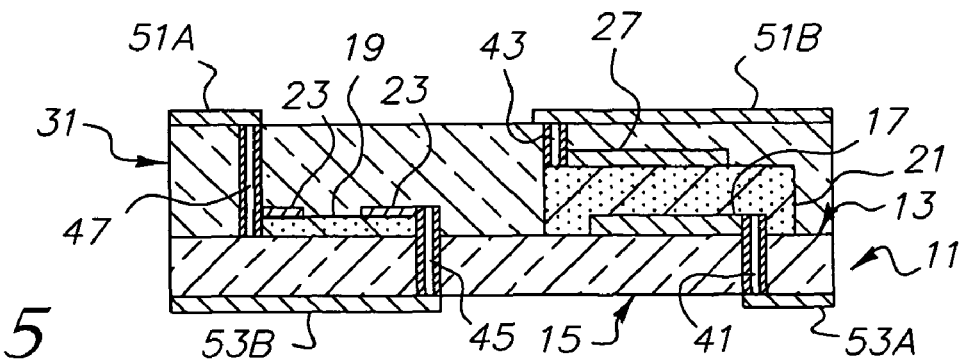

FIG. 5 represents the next (and final) steps in making a capacitive substrate according to one embodiment of the invention. The objective of these steps is to provide suitable electrical connections to the respective electrodes (conductors) for the capacitor, through one or both of the hardened glass layers 11 and 31. It is to be understood that such connections may be provided through but one of these glass layers, depending on the final use of the capacitive substrate (e.g., as a stand alone substrate, as an internal member within a larger substrate, etc.). The following description, in which such connections are formed through both glass layers, is thus representative only and not meant to limit the scope of this invention.

The electrical connections are thru-hole electrical connections, meaning that a hole is provided in the respective glass layer and then rendered conductive by the deposition of a suitable conductor (e.g., copper) on the internal walls thereof. One means of providing such holes is to use laser or mechanical drilling, the preferred being use of a laser in which a Nd:YAG laser is utilize. In FIG. 5, holes 41 and 43 are formed though glass layers 11 and 31, respectively. Each hole has an initial internal diameter of only about two mils. Following such hole formation, a thin strike of copper is electrodeposited onto the internal walls of each hole. In one embodiment, the copper may have a thickness of only about 0.5 mils, thereby leaving an internal open diameter of only about one mil. Hole 41 is seen to form an electrical connection path to the under conductor (electrode) 17 while hole 43 connects the upper conductor (electrode) 27. If a conductive member such as resistor 19 is used, similar thru-hole connections 45 and 47 may be formed to the spaced conducting members 23, as shown. Generally speaking, each of the thru-hole connections is accomplished by drilling a hole to the respective conductor so as to expose a portion of the conductor. Following this, the described conductive layer (e.g., the copper) is deposited both onto the hole walls but also onto the exposed portion (or at least part of) of the respective conductor.

The structure of FIG. 5 may now be exposed to additional steps in which further conductive layers are added. One such layer may include two or more conductive segments 51A and 51B, while another, on the opposite side of the structure, may include conductive segments 53A and 53B. Each such "segment" may be in the form of a signal line or pad or the like structure, and may be applied using known photolithographic processing used in the PCB industry. Both layers may be formed simultaneously, or separately. Under such processing, a photo-resist is applied, followed by alignment of a mask, and exposure of certain areas of the photo-resist then occurs. These procedures of course follow initial deposition of the metallurgy which forms the layers, which, in a preferred embodiment, involves electroplating a thin copper layer or laminating a thin copper foil in place on each side. Depending on whether a positive or negative photo-resist procedure is implemented, selected portions of the photo-resist are removed following an exposure operation, etching of the metal then occurs, leaving the desired pattern (i.e., in the case of the top layer, segments 51A and 51B). Photolithographic processing of this type is well known and further definition is not deemed necessary. In one embodiment, each of the conductive segments is, as stated, copper, albeit other metals, including alloys thereof, may be used. If the FIG. 5 structure is to have conductive layers on opposing sides (as shown), then the formed segments are preferably coupled to the respective thru-hole connections as shown. For example, segment 51B is coupled to thru-hole connection 43, segment 53A to connection 41, etc. Both capacitor and resistor are thus coupled to opposing segments. It is again to be remembered, however, that it is within the scope of the invention to provide all connections from a single side, thereby using only one layer of metallurgy and a corresponding number of conductive segments. Understandably, the formed segments may constitute circuit lines which may then be coupled to other circuitry (not shown) or to external electrical components (e.g., a semiconductor chip) or even an electrical assembly (e.g., a chip carrier) should the FIG. 5 structure be used as shown. As mentioned above, and described in greater detail below, is within the scope of this invention to incorporate the FIG. 5 structure within a larger, multi-layered structure (referred to as a circuitized substrate, two key examples being a PCB and a chip carrier, both of which products are sold by the Assignee of this invention).

Figure 6:
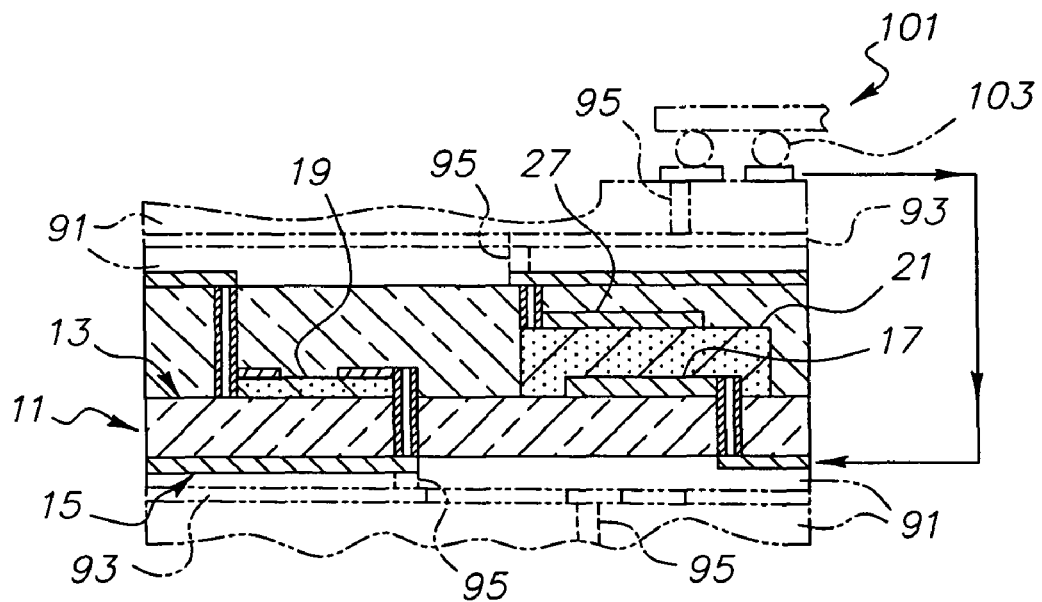
FIG. 6 is an enlarged elevational view, in cross-section, illustrating a capacitive substrate as shown in FIG. 5, with additional conductive and dielectric layers (in phantom) added on opposite sides thereof, and at least one electronic component positioned on the substrate.

FIG. 6 represents such a larger structure. As shown therein, additional dielectric layers 91 (phantom) and conductive layers 93 (also phantom) may be applied to opposite sides of the FIG. 5 substrate structure, in an alternating manner. Layers 91 may be of the above-described fiber-glass reinforced epoxy resin (also known as FR4 material) or other suitable dielectric. Layers 93 may be of conventional copper or copper allow material. One approach to accomplish this is to use conventional PCB lamination processing, in which one or more layers are added to each side at a time. Electrical coupling between selected segments of each layer (is said layer includes segments) may be accomplished by conventional PTH processing, FIG. 6 illustrating at least four examples of such PTH connections 95 (phantom). Connections 95 are merely representative of the fact that such connections may be used, and many more or less, including at many different locations, may be used. The structure of FIG. 6 is thus a circuitized substrate which includes as part thereof a capacitive substrate such as formed in FIG. 5. The circuitized substrate, with this internal capacitive substrate, is thus able to provide internal capacitance for the structure when used with other electrical components. One example of such an electrical component is represented by the number 101 in FIG. 6 and may comprise a semiconductor chip or even a larger component such as a chip carrier. This component may be coupled to the FIG. 6 substrate using conventional solder balls 103. With such a component (or more, if desired) as part thereof, FIG. 6 thus illustrates an electrical assembly which includes both a substrate and coupled components. Such an assembly is now capable of being utilized within a larger system such as an information handling system (defined above), a prime example of same being a personal computer.

Figure 7:
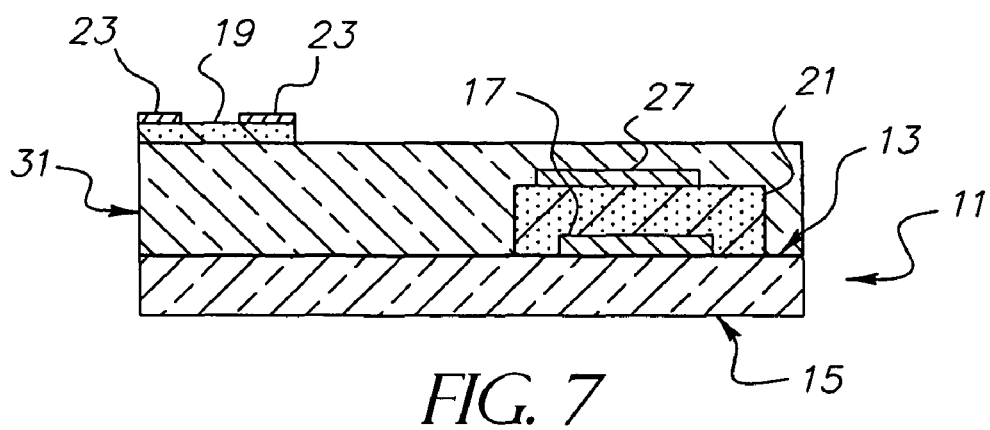
FIG. 7 is an enlarged elevational view, in cross-section, illustrating an alternative embodiment of a capacitive substrate of the invention.

FIG. 7 represents an alternative embodiment of the invention. Specifically, rather than form conductive member 19 on the same surface of first glass layer 11 as first conductor 17, as was accomplished in the above embodiment, it is possible to instead subsequently form this member on the outer surface of the second glass layer 31. (It is also possible to form two members 19, one on the layer 11 and another on layer 31.) Suitable thru-hole connections may then be made to the member's 23 or these members could be coupled to selected conductive segments (not shown) of a conductive layer (also not shown) applied onto the upper surface of layer 31. FIG. 7 thus represents the fact that alternative embodiments of forming conductive members are possible, and the invention is not limited to providing such conductive members on only the first glass layer 11.

According to the unique teachings of the instant invention, it is possible to vary the capacitance values of the capacitors formed by varying the thicknesses of the capacitance dielectric materials and/or the materials themselves, as well as by selective application of a laser annealing operation to the capacitance dielectric material which forms part of each capacitor. This represents a significant aspect of this invention because it enables the substrate manufacturer to meet the operational requirements of many circuit designs. A further significant aspect of the invention is that the capacitor formed may be connected to other capacitors or conductive elements (e.g., resistors) with thru holes. These connections can be either series or parallel connections. Thus, with the various electrode sizes, dielectric materials and thicknesses, an infinite number of capacitor values can be achieved in a single substrate. In one embodiment of this invention, as defined above, a laser annealing approach was used to fabricate capacitive substrates with a tunable property. The concept of laser processing is based on the interaction between laser radiation and materials. Different kinds of materials have different responses at a given laser wavelength and energy. For example, in the case of $BaTiO_3$/polymer-based nano-composites, when such nano-composites are exposed to the third harmonic of a Nd:YAG laser at sufficiently high energy density (and a wavelength of about 355 nm), the absorption properties of such materials favor ablation (drilling or micro-machining). On the other hand, for nano-composites exposed to an XeCl excimer laser operating at relatively low energy density (and a wavelength of about 308 nm), material absorption favors annealing (causing the polymer to melt and enhance particle contact), thereby producing high density capacitors. Thus, one can control laser processing by controlling energy density (fluence) and wavelength of the laser source. Laser annealing also increases crystallinity of polymers such as polyvinylidene fluoride (PVDF). PVDF is used in various device applications, due to its unique piezoelectric and pyroelectric properties. Another unique teaching of this invention is the development of new combinatorial capabilities for both the synthesis of new solid-state electronic materials and optimization of existing materials for tunable device applications. Libraries of different crystalline sol-gel thin films with a composition of $Ba_xTi_yO_z$ (where x=1, 2; y=1, 2, 9 and z=3, 7, 20) are generated by using variable multi-step laser and thermal annealing processes.

The following represent various examples of methods used to make a capacitive substrate according to the teachings herein. These are understood to be examples only and not limiting of the scope of this invention.

Example One $BaTiO_3$-thin films were prepared from a 0.5 molar aqueous acetate solution of $Ba(CH_3COO)_2$ and $Ti(OC_2H_5)_4$. The films were deposited on glass substrates and dried successively at 150° and 450° C. to remove all the organics. The films were then laser annealed at various fluences (energy densities) for one to 300 pulses per area. Additional post annealing (600° C. in air) was used to generate different crystalline phases in the laser-annealed spots. A second electrical conductor was then formed using a sputtering operation atop the cured film using a mask normally used for such sputtering operations. The resulting capacitance density of the formed capacitor measured about 3000-5000 pico-Farads (pF)/square millimeter at one Mega-Hertz (MHz). The following Table illustrates how a change of capacitance will occur with such laser anneal

TABLE

| Laser annealing | Post annealing | Capacitance (pF/mm$^2$) |
| --- | --- | --- |
| Blank | 600 degree C. for 1 hour | 1000 |
| 250 mJ/cm$^2$ for 50 pulses | 600 degree C. for 1 hour | 3000 |
| 370 mJ/cm$^2$ for 50 pulses | 600 degree C. for 1 hour | 5000 |

Example Two

BaTiO$_3$ powders (40 grams) were mixed with a solution containing two grams of n-phenylaminopropyltrimethoxy silane, ethanol (95 ml) and water (5 ml). The white suspension formed was ultrasonicated for five minutes and then stirred at 70° C. for one hour. The product was collected by centrifugation, washed with ethanol (120 ml×2) and vacuum dried. Epoxy based nanocomposites were prepared by mixing appropriate amounts of the organically modified BaTiO$_3$ powder, bisphenol A epoxy resin (M$_n$~377), dicyandiamide, and 2-methylimidazole in methylpyrrolidone (NMP). The mixture was stirred and ultrasonicated for five minutes to homogenize the dispersion of BaTiO$_3$. Composite thin films were deposited on Cu substrates, which served as the bottom electrode. The films were first dried at 75° C. for one hour followed by curing in a vacuum oven at 170° C. for fifteen hours. The films were then laser annealed at fluences (energy densities) 50-100 mille Jules (mJ)/square centimeter for one to 300 pulses per area. A second electrical conductor was then formed using a sputtering operation atop the cured film using a mask normally used for such sputtering operations. The resulting capacitance density of the formed capacitor measured about 1000-2000 pico-Farads (pF)/square millimeter at one Mega-Hertz (MHz).

Example Three 38.5 grams of an epoxy novolac resin (sold under the product name "LZ 8213" from Huntsman, Salt Lake City, Utah), containing about 35 wt % methyl ethyl ketone and 6.5 gm of a phenoxy resin (sold under the product name "PKHC" from Phenoxy Associates, Rock Hill, S.C.), containing 50 wt % methyl ethyl ketone, were mixed together with 100 gm of barium titanate (BaTiO3) powder (available from Cabot Corporation, Boyertown, Pa.), the barium titanate including fifty grams with a mean particle size of 0.065 micron and surface area of about 16 m2/gm, and fifty grams with a mean particle size of 0.12 micron and surface area of about 8.2 m2/gm. This mixture was mixed with thirteen grams of propylene glycol methyl ether acetate and twelve grams of methyl ethyl ketone and ball milled for three days. A thin film (about 2.5 microns thick) of this mixed composite was then deposited on a copper substrate and dried at approximately 140° C. for three minutes in an oven to remove residual organic solvents. This was followed by curing in an oven at 190° C. for two hours. Similarly, a thin film (about 8.5 microns thick) of this mixed composite was also deposited on a copper substrate and dried at approximately 140° C. for three minutes in an oven to remove residual organic solvents. This was followed by curing in an oven at 190° C. for two hours.

Thus there has been shown and described a capacitive substrate having at least one capacitor as part thereof. This capacitive substrate can then be incorporated into a larger circuitized structure, including by laminating other dielectric layers and forming other circuit elements as part thereof, if desired. The invention as defined herein, if desired, is capable of transmitting both regular and high speed (frequency) signals, the latter at a rate of from about one Gigabit/sec to about ten Gigabits/second, while substantially preventing impedance disruption. Of further significance, the invention, able to utilize thru-holes and other elements of very fine definition, is able to assure highly dense circuit patterns as are deemed extremely important with regards to many of today's design requirements.

While there have been shown and described what at present are considered the preferred embodiments of the invention, it will be obvious to those skilled in the art that various changes and modifications may be made therein without departing from the scope of the invention as defined by the appended claims.

What is claimed is:

1. A capacitive substrate comprising:
   a first unlaminated, pure glass layer having a first surface and a second surface;
   a first conductor directly bonded on said first surface of said first glass layer;
   a capacitive dielectric layer on said first surface of said first glass layer and substantially over said first conductor, said capacitive dielectric layer being heat treated at a temperature within the range of from about 400 degrees C. to about 800 degrees C., and laser annealed to fabricate capacitive substrates with a tunable property;
   a second conductor on said first capacitive dielectric layer;
   a second glass layer on said first capacitive dielectric layer and directly bonded substantially over said second conductor, said second glass layer having a first surface, said bonding of said second glass layer on said capacitive dielectric layer being performed by the heat treating thereof at a temperature within the range of from about 400 degrees C. to about 1000 degrees C.;
   a first thru-hole electrical connection to said first conductor; and
   a second thru-hole electrical connection to said second conductor, said first and second conductors and said capacitive dielectric layer forming a capacitor when said capacitive substrate is in operation.

2. The capacitive substrate of claim 1 wherein the material of said first and second conductors is selected from the group consisting of gold, aluminum, chrome, titanium, platinum, copper, nickel and alloys thereof, and tin oxide, indium tin oxide and doped tin oxide.

3. The capacitive substrate of claim 1 wherein the material of said capacitive dielectric layer is selected from the group consisting of barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, zinc oxide, titanium dioxide, lead iron tantalite, other ferroelectric tantalates, and combinations or mixtures thereof.

4. The capacitive substrate of claim 1 wherein each of said first and second thru-hole connections comprises copper.

5. The capacitive substrate of claim 1 further including a conductive member on said first surface of said first glass layer adjacent said first conductor.

6. The capacitive substrate of claim 1 further including third and fourth thru-hole electrical connections to said conductive member.

7. The capacitive substrate of claim 6 further including a first electrically conductive layer on said second surface of said first glass layer electrically coupled to said first and third thru-hole electrical connections and a second electrically conductive layer on said first surface of said second glass layer electrically coupled to said second and fourth thru-hole electrical connections.

8. The capacitive substrate of claim 1 further including a first electrically conductive layer on said second surface of said first glass layer electrically coupled to said first thru-hole electrical connection and a second electrically conductive layer on said first surface of said second glass layer electrically coupled to said second thru-hole electrical connection.

9. The capacitive substrate of claim 8 further including additional dielectric layers and conductive layers on opposing sides of said first and second glass layers in an alternating orientation.

10. The capacitive substrate of claim 1 further including additional dielectric layers and conductive layers on opposing sides of said first and second glass layers in an alternating orientation and at least one electronic component positioned on said capacitive substrate and electrically coupled to selected ones of said conductive layers and/or said capacitor.

11. The capacitive substrate of claim 1 wherein said laser annealing is performed at various fluences from one to 300 pulses per area to create various capacitances per area.

* * * * *